United States Patent
Kikuchi

(10) Patent No.: US 9,244,102 B2
(45) Date of Patent: Jan. 26, 2016

(54) COMPARATOR, OSCILLATOR USING THE SAME, DC/DC CONVERTER, CONTROL CIRCUIT THEREOF, AND ELECTRONIC APPARATUS

(71) Applicant: ROHM CO., LTD., Kyoto (JP)

(72) Inventor: Hiroki Kikuchi, Kyoto (JP)

(73) Assignee: ROHM CO., LTD. (JP)

( * ) Notice: Subject to any disclaimer, the term of this patent is extended or adjusted under 35 U.S.C. 154(b) by 362 days.

(21) Appl. No.: 13/748,946

(22) Filed: Jan. 24, 2013

(65) Prior Publication Data

US 2014/0043562 A1 Feb. 13, 2014

(30) Foreign Application Priority Data

Jan. 24, 2012 (JP) .................. 2012-012362

(51) Int. Cl.
*G02F 1/136* (2006.01)
*G01R 19/10* (2006.01)
*H02M 3/156* (2006.01)
*H03K 4/502* (2006.01)
*H03K 5/24* (2006.01)

(52) U.S. Cl.
CPC .............. *G01R 19/10* (2013.01); *H02M 3/156* (2013.01); *H03K 4/502* (2013.01); *H03K 5/2481* (2013.01)

(58) Field of Classification Search
CPC ... H03F 3/45085; H03F 3/45071; H03F 3/72; H03F 3/45896; H03F 1/0277; H03F 1/26; H03F 2200/27; H03F 2200/372; H03F 2203/21127; H03F 2203/7203; H03F 2203/7236; H03F 2203/45656; H03K 17/0822; H03K 5/088; H03K 19/007; H03K 4/502; H02M 2001/0058; H02M 3/07; H02M 3/33507; H02M 3/156; H05B 33/0815; G05F 1/575; G05F 1/136; G05F 1/1368; G05F 1/1343; G05F 1/1345; G05F 1/13458
USPC .......... 323/282, 280, 284, 288, 316; 330/257, 330/279, 127, 284, 69, 85; 327/537, 535, 327/541, 109, 206, 379, 387, 530, 538, 540, 327/543, 563, 66, 73, 88; 315/291, 307; 326/26, 83; 331/108 R; 349/61, 42, 38, 349/149, 43; 361/93.9, 54, 57, 93.1
See application file for complete search history.

(56) References Cited

U.S. PATENT DOCUMENTS 5,583,425 A * 12/1996 Rapp et al. .................... 323/316
2009/0027086 A1* 1/2009 Trifonov ......................... 327/66

* cited by examiner

*Primary Examiner* — Thoi Duong
(74) *Attorney, Agent, or Firm* — Cantor Colburn LLP

(57) ABSTRACT

A comparator compares a first input voltage and a second input voltage to generate a comparative output depending on a result of the comparison. The comparator includes a first input terminal configured to receive the first input voltage, a second input terminal configured to receive the second input voltage, a differential pair including a first input transistor whose control terminal is connected with the first input terminal and a second input transistor whose control terminal is connected with the second input terminal, a tail current source configured to supply a tail current to the differential pair, and a load circuit connected to the first input transistor and the second input transistor, and the tail current source increases the tail current, as the first input voltage approaches the second input voltage, depending on the first input voltage.

13 Claims, 9 Drawing Sheets

100

US 9,244,102 B2

COMPARATOR, OSCILLATOR USING THE SAME, DC/DC CONVERTER, CONTROL CIRCUIT THEREOF, AND ELECTRONIC APPARATUS

CROSS-REFERENCE TO RELATED APPLICATIONS

This application is based upon and claims the benefit of priority from Japanese Patent Application No. 2012-012362, filed on Jan. 24, 2012, the entire contents of which are incorporated herein by reference.

TECHNICAL FIELD

The present disclosure relates to a comparator, an oscillator using the same, a DC/DC converter, a controller thereof, and an electronic apparatus.

BACKGROUND

A voltage comparator (hereinafter, simply a comparator) is used to compare two voltages to determine a magnitude relationship therebetween. FIG. 1 is a circuit diagram showing a configuration of an oscillator 10 using the comparator. The oscillator 10 includes a capacitor C1, a discharging switch SW1, a comparator 100r, a logic circuit 12, a current mirror circuit CM1, and a constant current source CS1.

One end of the capacitor C1 is grounded. The constant current source CS1 generates a predetermined reference current $I_{REF}$. The current mirror circuit CM1 generates a charging current $I_{CHG}$ by multiplying the reference current $I_{REF}$ by a predetermined coefficient and supplies it to the capacitor C1. The discharging switch SW1 is provided in parallel with the capacitor C1.

The comparator 100r compares a ramp voltage $V_{RAMP}$ generated at the capacitor C1 and a predetermined peak voltage $V_{PEAK}$ to generate a comparative output CMP_OUT which is asserted (low level) when $V_{RAMP} > V_{PEAK}$. The logic circuit 12 generates a discharging signal CDIS which is asserted (high level) during a predetermined discharging period $T_{DIS}$ after the comparative output CMP_OUT is asserted, and outputs it to a control terminal (gate) of the discharging switch SW1 which is an N-channel MOSFET (Metal Oxide Semiconductor Field Effect Transistor).

FIG. 2 shows waveform diagrams indicating operations of the oscillator 10 in FIG. 1. Prior to time t0, the discharging signal CDIS is asserted to turn on the discharging switch SW1. During this period, the ramp voltage $V_{RAMP}$ is 0 V. When the discharging signal CDIS is negated at time t0, the discharging switch SW1 is turned off, and the ramp voltage $V_{RAMP}$ increases with a constant gradient over time according to an equation (1).

$$V_{RAMP} = t \times I_{CHG}/C1 \quad (1)$$

The discharging signal CDIS is asserted during the discharging period $T_{DIS}$ after the ramp voltage $V_{RAMP}$ reaches the peak voltage $V_{PEAK}$ at time t1, and negated again at time t2. The oscillator 10 repeats the operation performed during time t0 to time t2.

If the comparator 100r has an infinite response speed (i.e., zero delay), a cycle ($T_{OSC}$) of the oscillator 10 is given by a sum of a slope period $T_{SLOPE}$ and the discharging period $T_{DIS}$, as indicated in equations (2) and (3).

$$T_{OSC} = T_{SLOPE} + T_{DIS} \quad (2)$$

$$T_{SLOPE} = C1 \times V_{PEAK}/I_{CHG} \quad (3)$$

However, since the actual comparator 100r has a finite response speed, a delay τ occurs from when the $V_{RAMP}$ reaches the $V_{PEAK}$ until the comparative output CMP_OUT is asserted. In FIG. 2, waveforms when there is the delay τ are shown in broken lines. The delay τ is preferable to be as short as possible, since it affects the cycle of the oscillator 10.

Generally, it is necessary to increase an operating current (bias current) of the comparator 100r in order to accelerate its response speed. In particular, it is possible to reduce the delay τ by increasing a tail current of a differential amplifier provided on an initial stage or the bias current in an output stage of the comparator 100r. However, from a viewpoint of energy saving requirements for electronic apparatus in recent years, it is not preferable to conventionally increase the operating current of the comparator 100r.

SUMMARY

The present disclosure is made in view of the above problems, and various embodiments of the present disclosure is to provide a comparator, an oscillator using the same, a DC/DC converter, a controller thereof, and an electronic apparatus which can perform a high-speed voltage comparison while suppressing an increase in the operating current.

An embodiment of the present disclosure relates to a comparator which compares a first input voltage and a second input voltage, and generates a comparative output depending on a result of the comparison. The comparator includes a first input terminal configured to receive the first input voltage, a second input terminal configured to receive the second input voltage, a differential pair including a first input transistor whose control terminal is connected with the first input terminal and a second input transistor whose control terminal is connected with the second input terminal, a tail current source configured to supply a tail current to the differential pair, and a load circuit connected to the first input transistor and the second input transistor. The tail current source increases the tail current, as the first input voltage approaches the second input voltage, depending on the first input voltage.

According to the embodiment, as the first input voltage approaches the second input voltage, the tail current increases, thus raising the response speed. To the contrary, when there is a big difference between the two input voltages, the tail current decreases to reduce power consumption. Therefore, according to the embodiment, it is possible to perform a high-speed voltage comparison while suppressing an increase in the operating current.

The tail current source may include a first resistor provided between a first node which is a common connection point of the first input transistor and the second input transistor and a fixed-voltage terminal, and a first variable current source provided in parallel with the first resistor to generate a current which increases as the first input voltage approaches the second input voltage, depending on the first input voltage. According to the embodiment, it is possible to control the tail current, depending on the first input voltage.

The first variable current source may include a first current control transistor and a second resistor provided in series between the first node and the fixed-voltage terminal. In addition, a voltage depending on the first input voltage may be applied to a control terminal of the first current control transistor. According to the embodiment, it is possible to change the tail current linearly with respect to the first input voltage.

The first input voltage may be a voltage that varies over time, and the second input voltage may be a constant voltage.

In some embodiments, the comparator may further include an output stage configured to generate the comparative output depending on a signal generated at a second node which is a connection point between one of the first and second input transistors and the load circuit.

The output stage may include an output transistor having a control terminal to which the signal generated at the second node is input and a bias current source provided in series with the output transistor to supply the output transistor with the bias current. In addition, the comparative output may be a signal generated at a third node which is a connection point between the output transistor and the bias current source.

The bias current source may include a third resistor provided between the third node and the fixed-voltage terminal, and a second variable current source provided in parallel with the third resistor to generate a current which increases as the first input voltage approaches the second input voltage, depending on the first input voltage. According to the embodiment, it is possible to control the tail current depending on the first input voltage.

The second variable current source may include a second current control transistor and a fourth resistor provided in series between the third node and the fixed-voltage terminal. In addition, the voltage depending on the first input voltage may be applied to a control terminal of the second current control transistor. According to the embodiment, it is possible to change the bias current linearly with respect to the first input voltage.

The load circuit may be a current mirror circuit. The load circuit may include a first load resistor provided in series with the first input transistor and a second load resistor provided in series with the second input transistor.

Another embodiment of the present disclosure also relates to a comparator which compares a first input voltage and a second input voltage to generate a comparative output depending on a result of the comparison. The comparator includes a first input terminal configured to receive a first input voltage, a second input terminal configured to receive a second input voltage, a first input transistor which is an N-channel MOSFET whose gate is connected with the first input terminal, a second input transistor which is the N-channel MOSFET whose gate is connected with the second input terminal and whose source is connected with a source of the first input transistor, a first load transistor which is a P-channel MOSFET whose source is connected with a power supply terminal and whose drain and gate are connected with a drain of the first input transistor, a second load transistor which is the P-channel MOSFET whose source is connected with the power supply terminal, whose drain is connected with a drain of the second input transistor, and whose gate is connected with the gate of the first load transistor, a first resistor provided between a grounding terminal and sources of the first and second input transistors, a first current control transistor which is the N-channel MOSFET whose drain is connected with sources of the first and second input transistors and whose gate is connected with the first input terminal, and a second resistor provided between a source of the first current control transistor and the grounding terminal. The comparative output is generated depending on a signal generated at the drain of the second input transistor.

According the embodiment, it is possible to perform the high-speed voltage comparison while suppressing the increase in the operating current.

The comparator may further include an output transistor which is the P-channel MOSFET whose source is connected with the power supply terminal and whose gate is connected with the drain of the second input transistor, a third resistor provided between a drain of the output transistor and the grounding terminal, a second current control transistor which is the N-channel MOSFET whose drain is connected with the drain of the output transistor and whose gate is connected with the first input terminal, and a fourth resistor provided between a source of the second current control transistor and the grounding terminal.

Another embodiment of the present disclosure also relates to a comparator which compares a first input voltage and a second input voltage to generate a comparative output depending on a result of the comparison. The comparator includes a first input terminal configured to receive a first input voltage, a second input terminal configured to receive a second input voltage, a first input transistor which is a P-channel MOSFET whose gate is connected with the first input terminal, a second input transistor which is the P-channel MOSFET whose gate is connected with the second input terminal and whose source is connected with a source of the first input transistor, a first load transistor which is an N-channel MOSFET whose source is connected with the grounding terminal and whose drain and gate are connected with a drain of the first input transistor, a second load transistor which is the N-channel MOSFET whose source is connected with the grounding terminal, whose drain is connected with a drain of the second input transistor, and whose gate is connected with the gate of the first load transistor, a first resistor provided between the power supply terminal and sources of the first and second input transistors, a first current control transistor which is the P-channel MOSFET whose drain is connected with sources of the first and second input transistors and whose gate is connected with the first input terminal, and a second resistor provided between a source of the first current control transistor and the grounding terminal. The comparative output is generated depending on a signal generated at the drain of the second input transistor.

According the embodiment, it is possible to perform the high-speed voltage comparison while suppressing the increase in the operating current.

The comparator may further include an output transistor which is the N-channel MOSFET whose source is connected with the grounding terminal and whose gate is connected with the drain of the second input transistor, a third resistor provided between a drain of the output transistor and the power supply terminal, a second current control transistor which is the P-channel MOSFET whose drain is connected with the drain of the output transistor and whose gate is connected with the first input terminal, and a fourth resistor provided between a source of the second current control transistor and the power supply terminal.

Another embodiment of the present disclosure relates to an oscillator. The oscillator may include a capacitor whose first terminal has a fixed potential, a discharging switch provided in parallel with the capacitor, a current source configured to supply a predetermined current to a second terminal of the capacitor, a comparator which has a first input terminal configured to receive a voltage generated at the capacitor and a second terminal configured to receive a predetermined peak voltage to generate a comparative output depending on a result of comparing the voltage generated at the capacitor with the predetermined peak voltage, and a logic circuit configured to turn on the discharging switch for a predetermined discharging duration after the comparative output indicates the voltage generated at the capacitor have reached the predetermined peak voltage. According to the embodiment, it is possible to increase the response speed of the comparator, thus improving a stability of cycle.

Another embodiment of the present disclosure relates to a control circuit of the DC/DC converter. The control circuit includes the above-described oscillator, a pulse modulator configured to generate a pulse signal whose duty ratio is adjusted so that a feedback voltage depending on an output voltage of the DC/DC converter may approach a predetermined target level in synchronization with a periodic signal generated by the oscillator, and a driver configured to switch a switching transistor of the DC/DC converter based on the pulse signal.

The pulse modulator includes an error amplifier configured to compare the feedback voltage depending on the output voltage of the DC/DC converter with a predetermined reference voltage to generate an error voltage, a current sensing comparator configured to compare a detection voltage depending on a current flowing through the switching transistor of the DC/DC converter with the error voltage to generate an OFF signal which is asserted when the detection voltage reaches the error voltage, and a flip-flop configured to generate a pulse signal which becomes an ON/OFF level in corresponding to an ON/OFF state of the switching transistor each time an ON/OFF signal generated from the oscillator is asserted when the discharging switch is turned off.

The control circuit may be integrated on a single semiconductor substrate. "Integrated" indicates a situation where all components of a circuit are formed on the semiconductor substrate or a situation where main components of the circuit are integrated, thus allowing some resistors or capacitors for adjusting circuit constants to be provided outside the semiconductor substrate.

Another embodiment of the present disclosure relates to a DC/DC converter. The DC/DC converter may include the above-described control circuit. According to the embodiment, it is possible to stabilize a switching cycle of the switching transistor.

Another embodiment of the present disclosure relates to an electronic apparatus. The electronic apparatus may include the above-described DC/DC converter.

Another embodiment of the present disclosure relates to an electronic apparatus. The electronic apparatus may include a liquid crystal display, a diode string which includes a plurality of diodes connected in series and is provided as a backlight of the liquid crystal display, a current driver connected to a cathode of the diode string, and the above-described DC/DC converter having an output terminal connected to an anode of the diode string and having a feedback voltage which is a voltage generated across the current driver.

Any combination of the above-described components or any substitution of components or expressions of the present disclosure among methods, apparatuses, systems or the like may also be effective as the embodiments.

DETAILED DESCRIPTION

Reference will now be made in detail to various embodiments, examples of which are illustrated in the accompanying drawings. In the following detailed description, numerous specific details are set forth in order to provide a thorough understanding of the present invention(s). However, it will be apparent to one of ordinary skill in the art that the present invention(s) may be practiced without these specific details. In other instances, well-known methods, procedures, systems, and components have not been described in detail so as not to unnecessarily obscure aspects of the various embodiments.

Certain embodiments of the present disclosure will now be described in detail with reference to the drawings. Throughout the drawings described herein below, identical or equivalent components, members, and processes will be designated by identical reference symbols, and repeated descriptions will be omitted. Further, these embodiments are presented by way of example only and are not intended to limit the scope of the disclosures, and all characteristics described in the embodiments or any combination thereof are not necessarily essential to the present disclosure.

As used herein, "a state in which a member A is connected with a member B" includes not only a case in which the member A and the member B are connected directly and physically, but also a case in which the member A and the member B are connected indirectly via another member which does not affect electrical connection status. Similarly, "the state in which a member C is provided between a member A and a member B" includes not only a case in which the member A and the member C or the member B and the member C are directly connected, but also a case in which the member A and the member C or the member B and the member C are indirectly connected via another member which does not affect electrical connection status.

Further, "a signal A (voltage or current) is depending on a signal B (voltage or current)" means the signal A is correlated with the signal B, more specifically, means (i) the signal A is the signal B, (ii) the signal A is proportional to the signal B, (iii) the signal A is obtained by level-shifting the signal B, (iv) the signal A is obtained by amplifying the signal B, (v) the signal A is obtained by inverting the signal B, or (vi) any combination thereof. Those skilled in the art would understand a range of "depending on" is determined depending on types and applications of the signals A and B.

Figure 3:
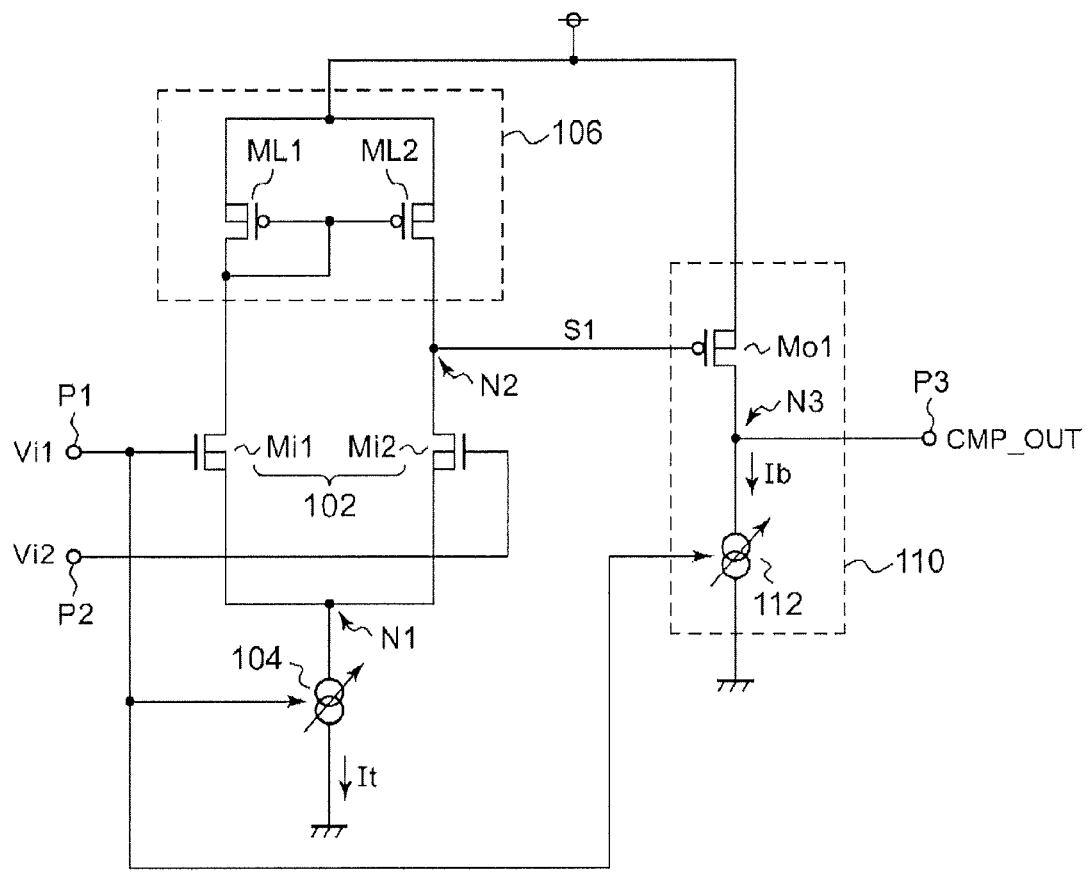
FIG. 3 is a circuit diagram showing a configuration of the comparator according to an embodiment of the present disclosure.

FIG. 3 is a circuit diagram showing a configuration of a comparator 100 according to an embodiment of the present disclosure. The comparator 100 compares a first input voltage Vi1 and a second input voltage Vi2, and outputs a comparative output CMP_OUT depending on a result of the comparison.

The comparator 100 includes a first input terminal P1, a second input terminal P2, an output terminal P3, a differential pair 102, a tail current source 104, a load circuit 106, and an output stage 110. The first input voltage Vi1 is input to the first input terminal P1 and the second input voltage Vi2 is input to the second input terminal P2.

The differential pair includes a first input transistor Mi1 whose control terminal (gate) connected to the first input terminal P1 and a second input transistor Mi2 having a control terminal connected to the second input terminal P2. A connection point of the first input transistor Mi1 and the second input transistor Mi2 is referred to as a first node N1. The tail current source 104 is connected with the first node N1 to supply the differential pair 102 with a tail current It. The load circuit 106 is connected with drains of the first input transistor Mi1 and the second input transistor Mi2 of the differential pair 102.

The load circuit 106 in FIG. 3, which is a so-called current mirror circuit, includes a first load transistor ML1 provided in series with the first input transistor Mi1 and a second load transistor ML2 provided in series with the second input transistor Mi2. Control terminals (gates) of the first load transistor ML1 and the second load transistor ML2 are connected in common so as to form the current mirror circuit.

A resistive load may be provided instead of the load circuit 106. In this case, the first load transistor ML1 is replaced with a first load resistor and the second load transistor ML2 is replaced with a second load resistor.

The tail current source 104 increases the tail current It, as the first input voltage Vi1 approaches the second input voltage Vi2, depending on the first input voltage Vi1. For example, the tail current source 104 is designed to increase the tail current It as the first input voltage Vi1 increases, when the comparator 100 is used mainly in a situation where Vi1<Vi2. The tail current source 104 is designed to increase the tail current It as the first input voltage Vi1 decreases, when the comparator 100 is used mainly in a situation where Vi1>Vi2.

The output stage 110 generates the comparative output CMP_OUT depending on a signal S1 generated at a second node N2 which is a connection point of the second input transistor Mi2 and the load circuit 106. For example, the output stage 110 includes an output transistor Mo1 and a bias current source 112.

The output transistor Mo1 and the bias current source 112 form a common-source amplifier. The output transistor Mo1 is a P-channel MOSFET having a control terminal (gate) to which the signal S1 generated at the second node N2 is inputted. The bias current source 112 is provided in series with the output transistor Mo1 to supply a bias current Ib to the output transistor Mo1. The comparative output CMP_OUT is a signal generated at a third node N3 which is a connection point of the output transistor Mo1 and the bias current source 112.

The bias current Ib of the output stage 110 may increase as the first input voltage Vi1 approaches the second input voltage Vi2, depending on the first input voltage Vi1. For example, the output stage 110 is configured to increase the bias current Ib as the first input voltage Vi1 increases, when the comparator 100 is used mainly in the situation where Vi1<Vi2. The output stage 110 is configured to increase the bias current Ib as the first input voltage Vi1 decreases, when the comparator 100 is used mainly in the situation where Vi1>Vi2.

Figure 4:
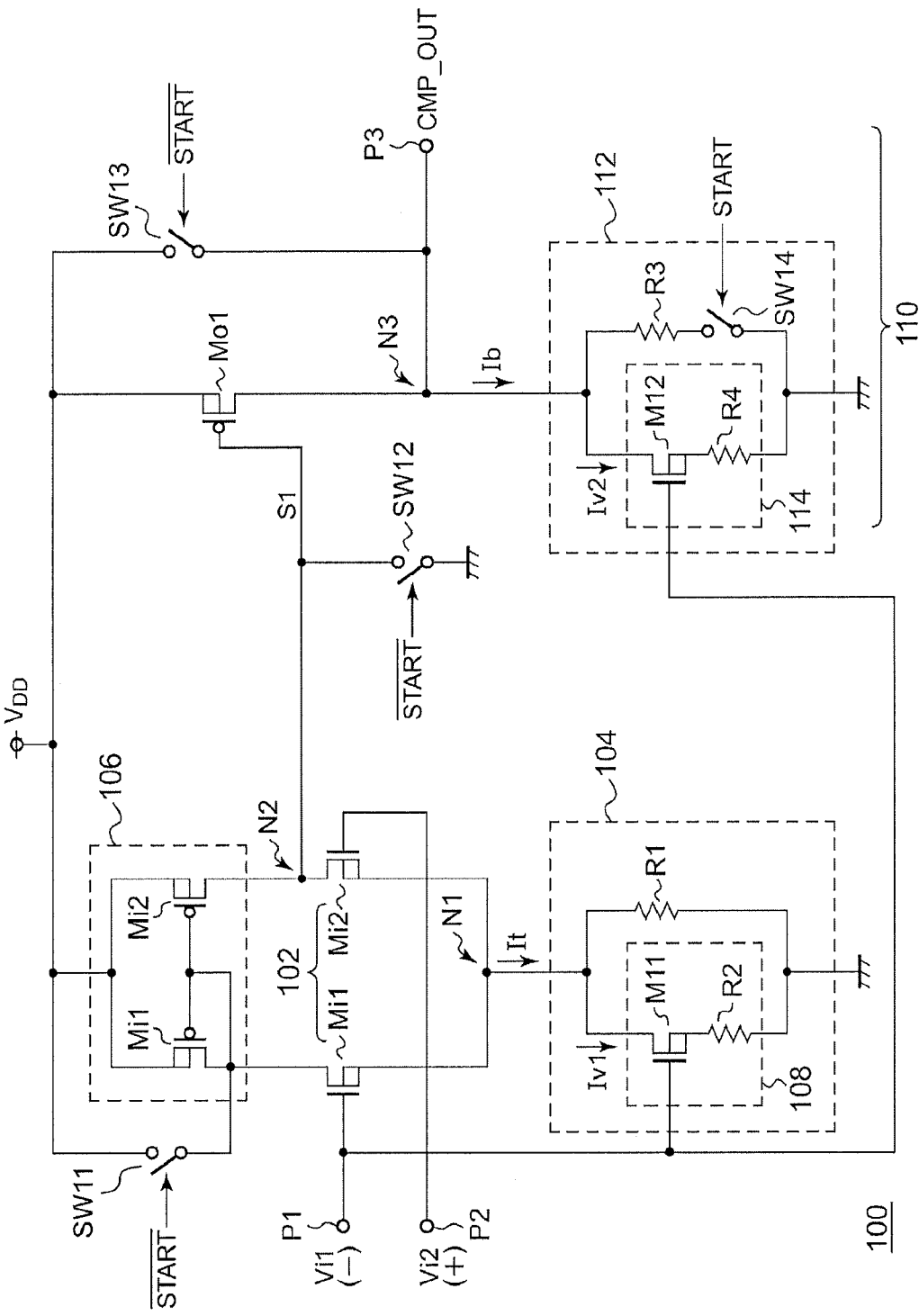
FIG. 4 is a specific circuit diagram of the comparator of FIG. 3.

FIG. 4 is a specific circuit diagram of the comparator 100 of FIG. 3. In the following, the comparator 100 is used mainly in the situation where Vi1<Vi2. For example, such a relationship may be established in the oscillator 10 shown in FIG. 1.

The tail current source 104 includes a first resistor R1 and a first variable current source 108. The first resistor R1 is provided between the first node N1 and a fixed-voltage terminal (grounding terminal). The first variable current source 108 is provided in parallel with the first resistor R1. The first variable current source 108 generates a current Iv1 which increases as the first input voltage Vi1 approaches the second input voltage Vi2, depending on the first input voltage Vi1. The tail current It is a sum of a current $I_{R1}$ flowing through the first resistor R1 and a current Iv1 generated by the first variable current source 108.

The first variable current source 108 includes a first current control transistor M11 and a second resistor R2. The first current control transistor M11 and the second resistor R2 are provided in series between the first node N1 and the fixed-voltage terminal (grounding terminal). The first current control transistor M11 is an N-channel MOSFET having a control terminal (gate) to which the voltage depending on the first input voltage Vi1 is applied.

When a gate-source threshold voltage is $V_{TH}$, a source voltage of the first current control transistor M11 is given by Vi1−$V_{TH}$. As a result, the first variable current Iv1 may become as follows:

$$Iv1=(Vi1-V_{TH})/R2,$$

which varies linearly depending on the first input voltage Vi1.

The bias current source 112 is configured in the same manner as the tail current source 104 and includes a third resistor R3 and a second variable current source 114. The bias current Ib is a sum of a current $I_{R3}$ flowing through the third resistor R3 and a current Iv2 generated by the second variable current source 114. The second variable current source 114 is configured in the same manner as the variable current source 108 and includes a second current control transistor M12 and a fourth resistor R4. The second variable current source 114 may change the current Iv2 linearly, depending on the input voltage Vi1, as follows.

$$Iv2=(Vi1-V_{TH})/R4$$

The second resistor R2 and the fourth resistor R4 may be formed with poly resistors. Thus, it is possible to cancel temperature dependence of the currents Iv1 and Iv2. Preferably, corresponding elements in the tail current source 104 and the bias current source 112 are placed in proximity to each other, more specifically, the first resistor R1 and the third resistor R3, the second resistor R2 and the fourth resistor R4, and the first current control transistor M11 and the second current control transistor M12 are placed in proximity to each other (pairing), respectively. This makes it possible to reduce a relative error between the tail current It and the bias current Ib.

A start signal START which is maintained at a high level during the operation of the comparator 100 and at a low level during a shutdown of the comparator 100 is input to the comparator 100. The comparator 100 includes shutdown switches SW11 to SW14. The switches SW11, SW12 and SW13 are turned on when the start signal START is at the low level, and the switch SW14 is turned on when the start signal START is at the high level.

The configuration of the comparator 100 is described as above. In the comparator 100, the tail current It increases as the first input voltage Vi1 approaches the second input voltage Vi2, thus increasing the response speed. On the contrary, when the difference between the two input voltages Vi1 and Vi2 increases, the tail current It decreases, thus making it possible to reduce power consumption.

In addition, in the comparator 100, the bias current Ib of the output stage 110 increases as the first input voltage Vi1 approaches the second input voltage Vi2, thus increasing the response speed. On the contrary, when the difference between the two input voltages Vi1 and Vi2 increases, the bias current Ib decreases, thus making it possible to reduce power consumption.

Thus, according to the comparator 100 of the embodiment, it is possible to perform the high-speed voltage comparison while suppressing the increase in the operating current.

Next, a suitable use of the comparator 100 will be described. The comparator 100 may be used in the oscillator 10 of FIG. 1. In this case, the first input terminal P1 corresponds to an inverting input terminal (−) and the second input terminal P2 corresponds to a non-inverting input terminal (+). In addition, the first input voltage Vi1 corresponds to the voltage $V_{RAMP}$ of the capacitor C1 having a slope portion, and the second input voltage Vi2 is the peak voltage $V_{PEAK}$ having a constant level. For this use, the comparator 100 is operated mainly when Vi1<Vi2. The comparative signal CMP_OUT is at the high level (negated) when Vi1<Vi2, and at the low level (asserted) when Vi1>Vi2.

Figure 1:
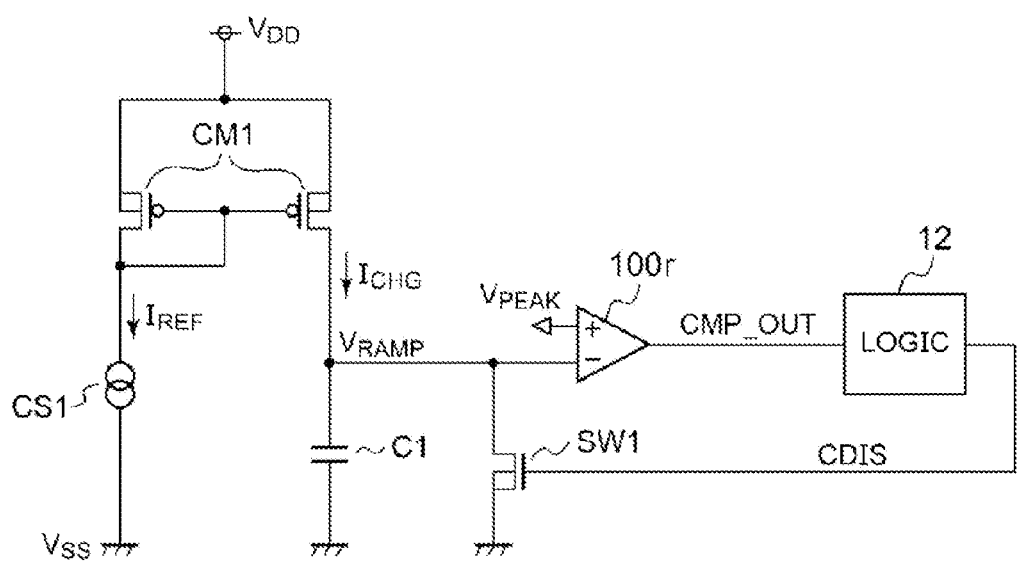
FIG. 1 is a circuit diagram showing a configuration of an oscillator using a comparator.
Figure 2:
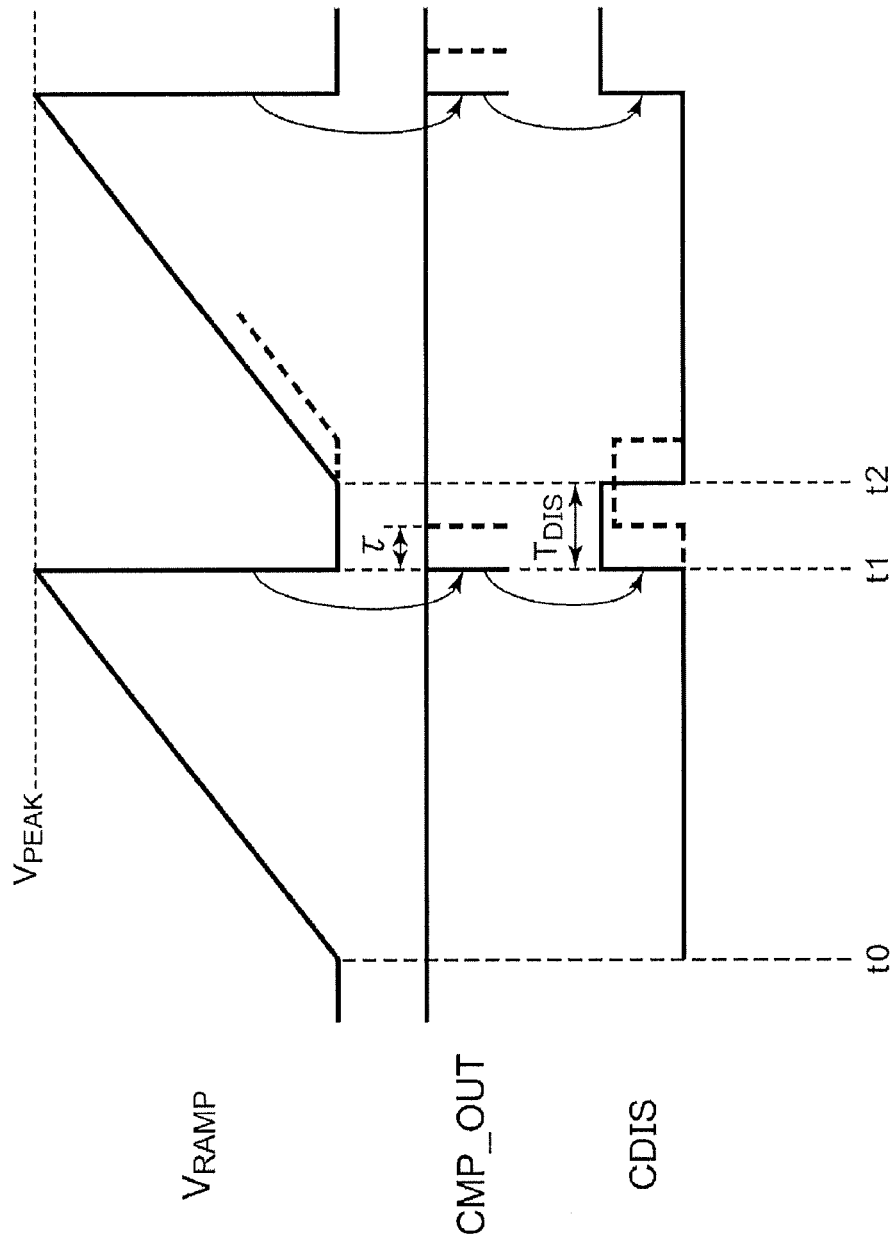
FIG. 2 shows waveform diagrams indicating operations of the oscillator of FIG. 1.
Figure 5:
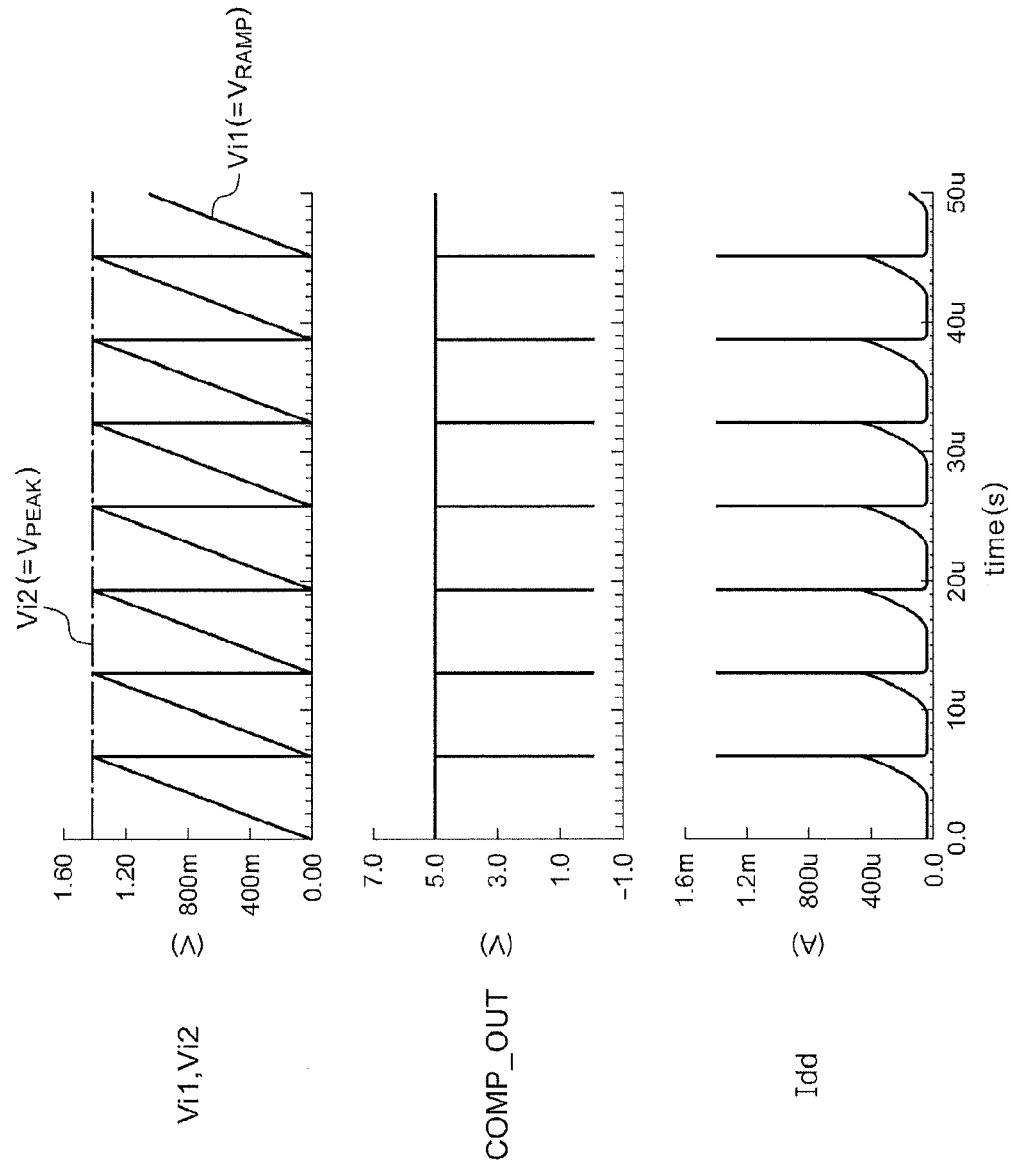
FIG. 5 shows waveform diagrams indicating operations of the oscillator of FIG. 1 using the comparator according to the embodiment of the present disclosure.

FIG. 5 shows waveform diagrams indicating operations of the oscillator of FIG. 1 using the comparator 100 according to the embodiment. Idd represents an operating current of the comparator 100. The operating current Idd is mainly a sum of the tail current It and the bias current Ib.

As described above, the tail current It and the bias current Ib decrease, when the first input voltage Vi1 decreases, that is, the difference between the first input voltage Vi1 and the second input voltage Vi2 increases. In addition, as the first input voltage Vi1 increases to reduce the difference between the two voltages, the currents It and Ib increase, thus increasing the response speed of the comparator 100.

The operating current Idd increases to 400 µA, when the first input voltage Vi1 and the second input voltage Vi2 are crossed. Therefore, the operating current needs to be 400 µA normally, in order to obtain the same response speed as in the conventional comparator 100r. On the other hand, according to the comparator 100 of the embodiment of the present disclosure, an average of the operating current Idd is as low as 130 µA, thus suppressing the increase in the operating current.

Figure 6:
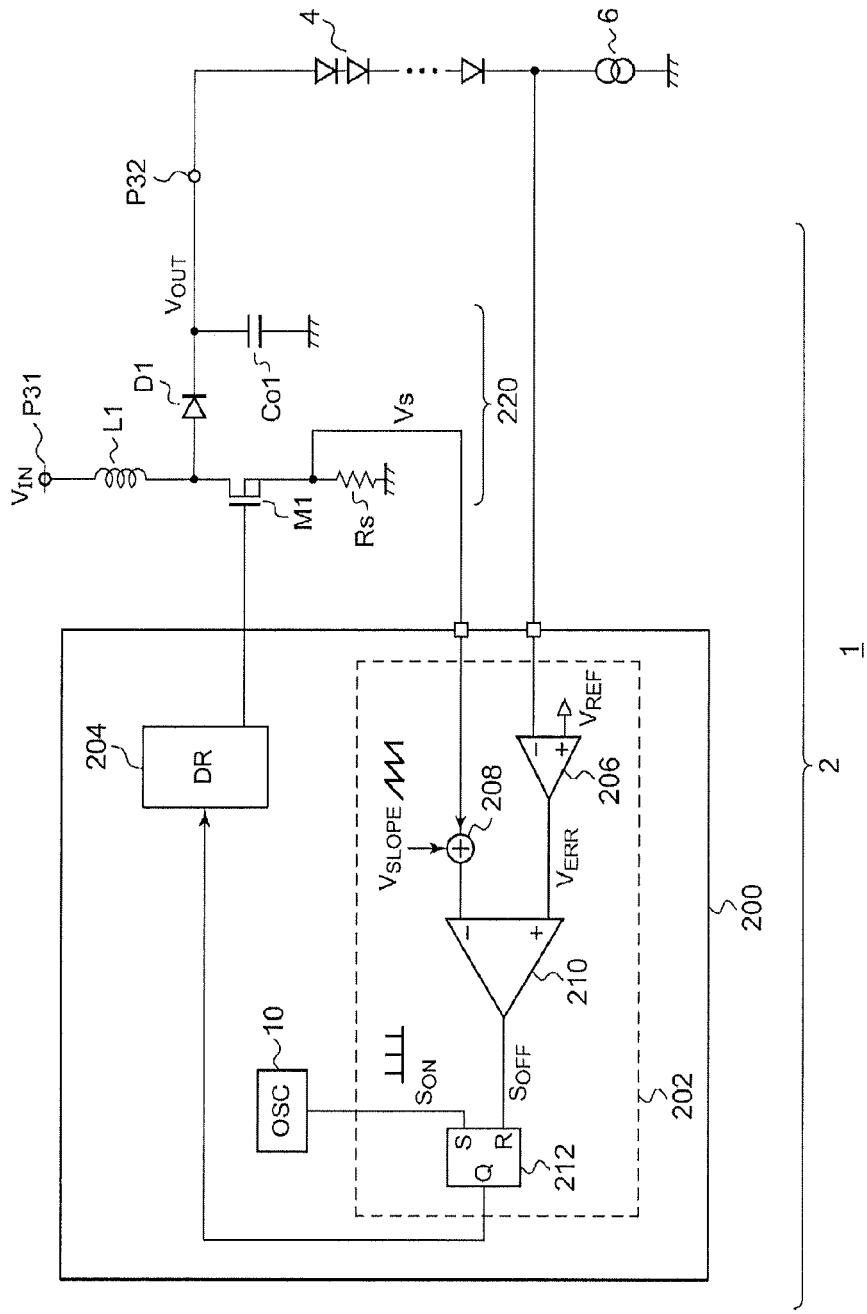
FIG. 6 is a circuit diagram showing a configuration of a DC/DC converter including the oscillator.

Next, the use of the oscillator 10 will be described. FIG. 6 is a circuit diagram showing a configuration of a DC/DC converter including the oscillator 10. The DC/DC converter 2 is installed in an electronic apparatus 1. In addition to the DC/DC converter 2, the electronic apparatus 1 includes an LED (light emitting diode) string 4 which is a light emitting element and a current driver 6.

The LED string 4 includes a plurality of LEDs connected in series. An anode of the LED string 4 is connected to an output terminal P32 of the DC/DC converter 2. The DC/DC converter 2 boosts an input voltage $V_{IN}$ of an input terminal P31, and supplies an output voltage $V_{OUT}$ to the LED string 4 connected to the output terminal P32. The current driver 6 is connected to a cathode of the LED string 4 to supply a driving current $I_{LED}$ to the LED string 4.

The DC/DC converter 2 includes a control circuit 200 and an output circuit 220. The output circuit 220 includes an inductor L1, a rectifier diode D1, an output capacitor Co1, a switching transistor M1, and a current sensing resistor Rs. Topology of the output circuit 220 will not be described because it is commonly known.

The control circuit 200 is a functional IC integrated on a single semiconductor substrate and includes the oscillator 10 according to the embodiment, a pulse modulator 202, and a driver 204. As described above, the oscillator 10 oscillates at a predetermined frequency. The pulse modulator 202 generates a pulse signal $S_{PWM}$ whose duty ratio is adjusted so that a feedback voltage $V_{FB}$ depending on the output voltage $V_{OUT}$ of the DC/DC converter 2 may approach a predetermined target level $V_{REF}$, in synchronization with a periodic signal generated by the oscillator 10. In FIG. 6, the feedback voltage $V_{FB}$ is a cathode voltage of the LED string 4, in other words, a voltage across the current driver 6.

The driver 204 switches the switching transistor M1 based on the pulse signal $S_{PWM}$.

Pulse modulator 202 of FIG. 6 is a peak current mode modulator. An error amplifier 206 compares the feedback voltage $V_{FB}$ and the reference voltage $V_{REF}$ to generate an error voltage $V_{ERR}$. A detection voltage Vs proportional to the current flowing through the switching transistor M1 occurs at the current sensing resistor Rs. A slope compensation circuit 208 superimposes a slope signal $V_{SLOPE}$ on the detection voltage Vs. A current sensing comparator 210 compares a detection voltage Vs' on which the slope signal $V_{SLOPE}$ is superimposed with the error voltage $V_{ERR}$ to generate an off signal $S_{OFF}$ which is asserted (high level) when the detection voltage Vs' approaches the error voltage $V_{ERR}$.

The oscillator 10 is an ON signal generator configured to generate an ON signal $S_{ON}$ which is asserted (high level) when a discharging switch SW1 within the oscillator 10 is turned off, in other words, at a negative edge of a discharging signal CDIS.

A flip-flop 212 generates the pulse signal $S_{PWM}$ which becomes an ON level in corresponding to an ON state of the switching transistor M1 each time the ON signal $S_{ON}$ is asserted and becomes an OFF level in corresponding to an OFF state of the switching transistor M1 each time the OFF signal $S_{OFF}$ is asserted.

Configurations of the DC/DC converter 2 and the electronic apparatus 1 are described as above. Since the cycle of the oscillator 10 is stable, the switching cycle of the switching transistor can be stabilized.

Figure 7A:
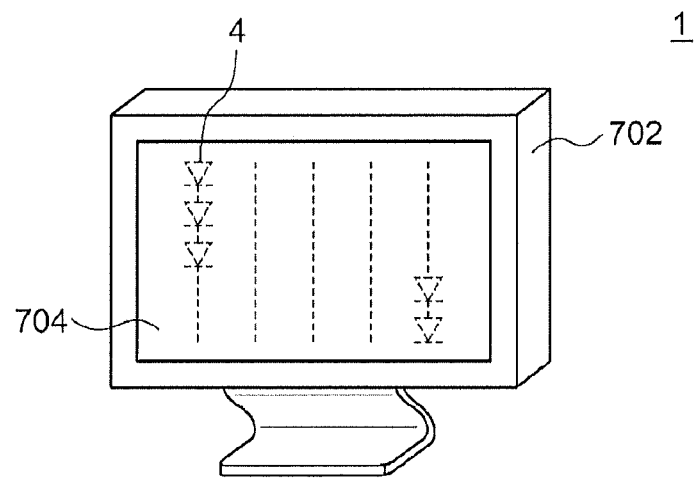
FIGS. 7A and 7B show examples of electronic apparatuses including the DC/DC converter of FIG. 6.
Figure 7B:
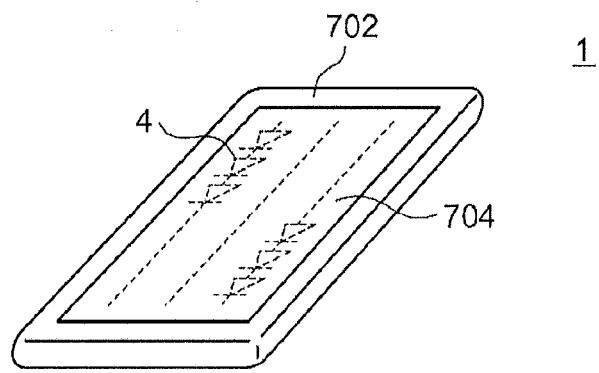

FIGS. 7A and 7B are diagrams showing examples of the electronic apparatus 1 including the DC/DC converter of FIG. 6. The electronic apparatus 1 of FIG. 7A may be a television or a display device, and the electronic apparatus 1 of FIG. 7B may be a tablet PC, a PDA (Personal Digital Assistant), a cellular phone handset or the like. The electronic apparatus 1 includes a housing 702 and a liquid crystal display panel 704. The LED string 4 of FIG. 6 is arranged as a backlight on a back of the liquid crystal display panel 704.

The present disclosure has been described as above, based on the embodiments. The embodiments are merely examples and various modifications may also be available to combinations of each component or each process of the embodiments. Further, it will be understood by those skilled in the art that such modifications would fall within the scope of the present disclosure. The following describes the modifications.

Figure 8:
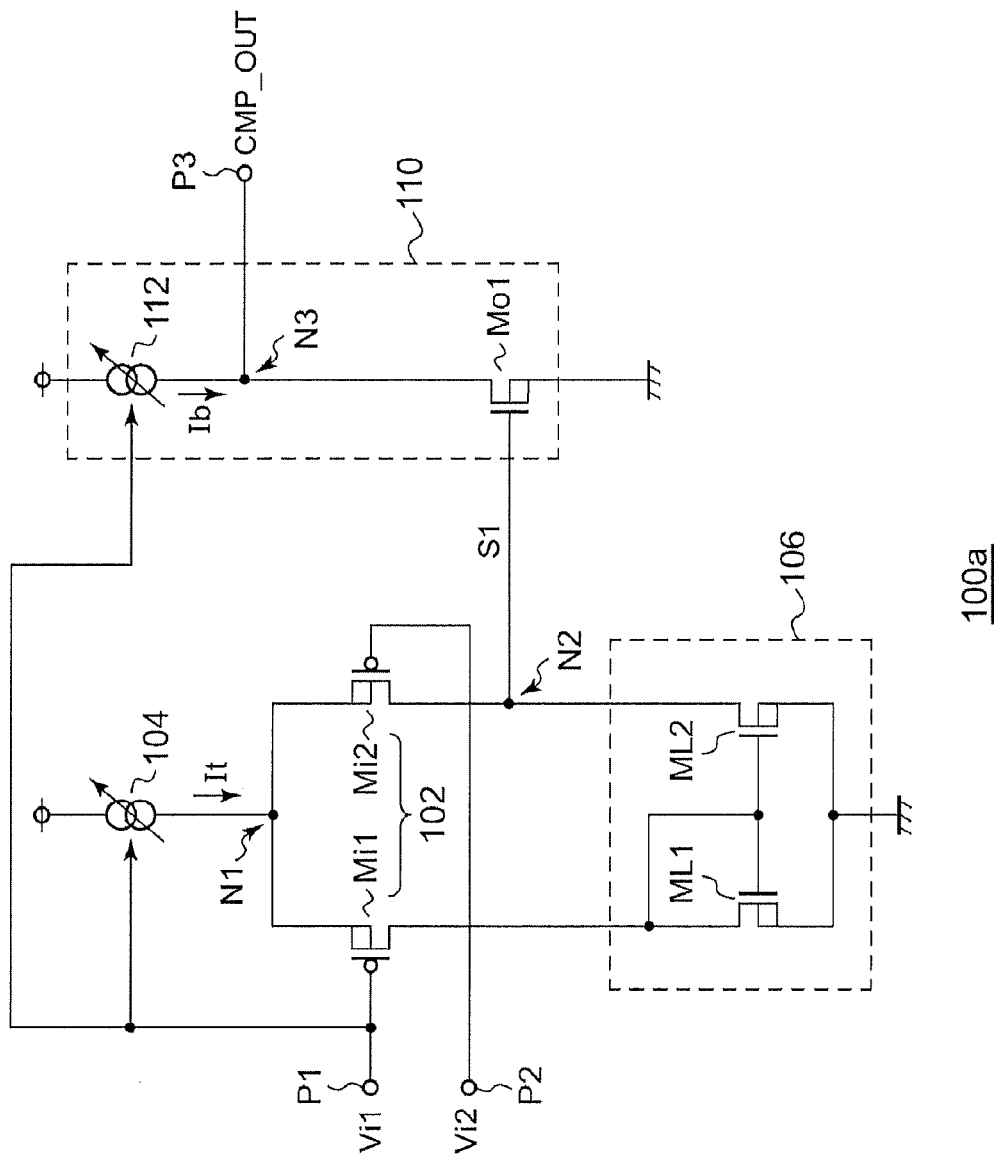
FIG. 8 is a circuit diagram showing a configuration of a converter according to a modification of the embodiment of the present disclosure.
Figure 9:
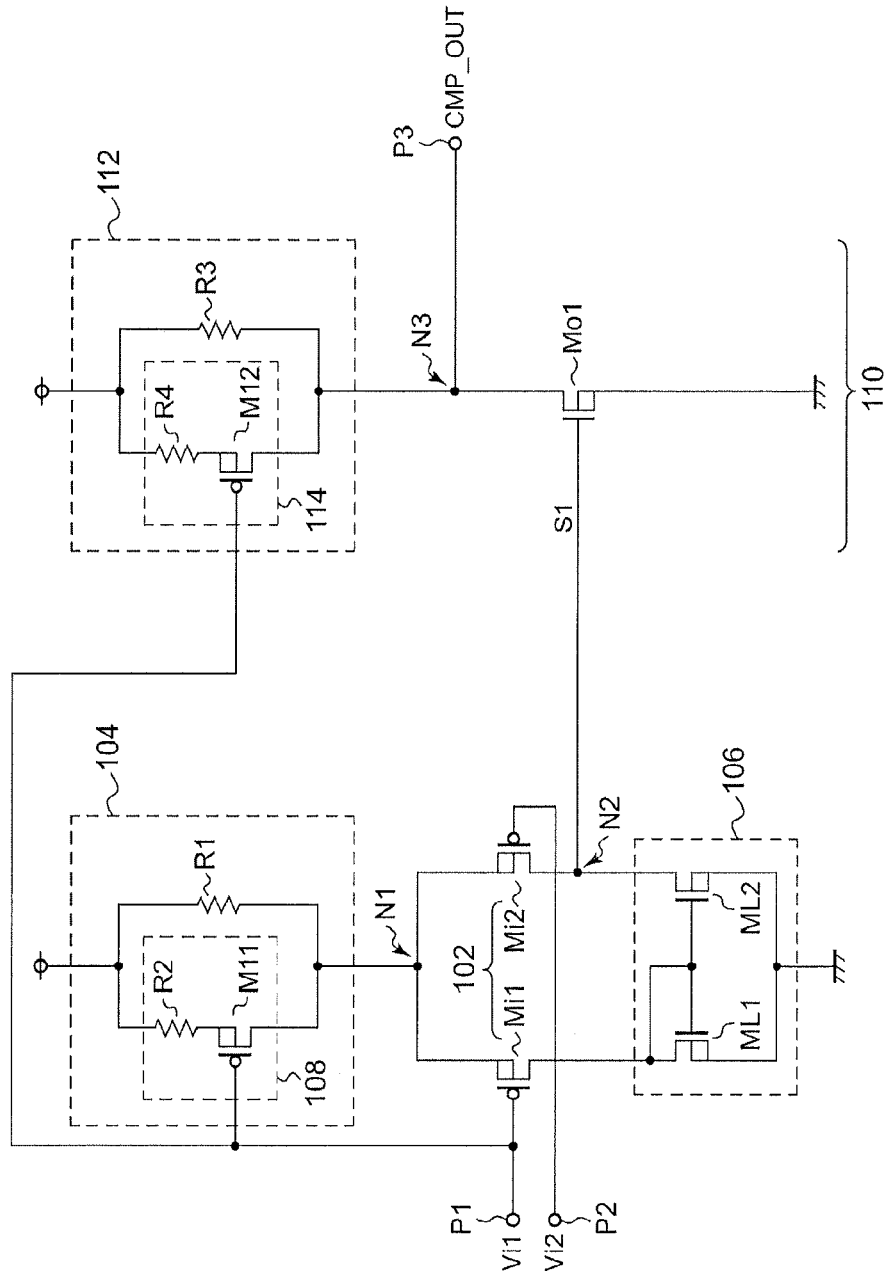
FIG. 9 is a specific circuit diagram of the comparator of FIG. 8.

In the embodiment, the case where the differential pair 102 includes the N-channel MOSFET has been described. However, the differential pair 102 may include the P-channel MOSFET. FIG. 8 is a circuit diagram showing a configuration of a comparator 100a according to a modification. FIG. 9 is a specific circuit diagram of the comparator 100a of FIG. 8. In the comparator 100a of FIGS. 8 and 9, a power supply terminal and a grounding terminal are inverted by interchanging the N-channel and the P-channel of the comparator 100 of FIGS. 3 and 4. Shutdown switches are omitted in FIG. 9. According to the modification, it is also possible to obtain the same effect as that of the comparator 100 of FIG. 4.

Further, the MOSFET may be replaced with a bipolar transistor.

The configuration of the first variable current source 108 is not limited to that of FIG. 4. For example, the first current control transistor M11 and the second resistor R2 may be interchanged. Further, another known variable current source may be used.

In the embodiment, the case where both the tail current It and the bias current Ib are changed has been described, but the present disclosure is not limited thereto, and only the tail current It may be changed or only the bias current Ib may be changed depending on the first input voltage Vi1.

In the embodiment, the oscillator 10 has been illustrated as an example of a device using the comparator 100, but the present disclosure is not limited thereto. For example, the comparator 100 may also be used as the current sensing comparator 210 of FIG. 6.

The configuration or the type of load of the DC/DC converter 2 is not limited to those of FIG. 6. The DC/DC converter 2 may be a buck converter or a buck-boost converter. In addition, the feedback voltage $V_{FB}$ may be a voltage obtained by dividing the output voltage $V_{OUT}$. In addition, the pulse modulator 202 may be a voltage mode pulse modulator or an average current mode modulator. The load of the DC/DC converter 2 may be a microprocessor, a liquid crystal display driver, another power supply circuit, another analog circuit or a digital circuit, etc.

The present disclosure has been described using concrete phrases based on the embodiments, but the embodiments merely illustrate the principle and applications of the present disclosure and many modifications or changes of dispositions may be made in the embodiments without departing from the spirit of the present disclosure defined by the claims.

According to the embodiments of the present disclosure, it is possible to provide the comparator which can perform the high-speed voltage comparison while suppressing the increase in the operating current.

While certain embodiments have been described, these embodiments have been presented by way of example only, and are not intended to limit the scope of the inventions. Indeed, the embodiments herein may be embodied in a variety of other forms. Furthermore, various omissions, substitutions and changes in the form of the embodiments described herein may be made without departing from the spirit of the inventions. The accompanying claims and their equivalents are intended to cover such forms or modifications which would fall within the scope and spirit of the present disclosure.

What is claimed is:

1. A comparator comparing a first input voltage and a second input voltage to generate a comparative output depending on a result of the comparison, comprising:
   a first input terminal configured to receive the first input voltage;
   a second input terminal configured to receive the second input voltage;
   a differential pair including a first input transistor whose control terminal is connected with the first input terminal and a second input transistor whose control terminal is connected with the second input terminal;
   a tail current source configured to supply a tail current to the differential pair; and
   a load circuit connected to the first input transistor and the second input transistor,
   wherein the tail current source increases the tail current, as the first input voltage approaches the second input voltage, depending on the first input voltage, and
   wherein the tail current source includes:
   a first resistor provided between a first node and a fixed-voltage terminal, the first node being a common connection point of the first input transistor and the second input transistor; and
   a first variable current source configured to generate a current which increases as the first input voltage approaches the second input voltage depending on the first input voltage, the first variable current source being provided in parallel with the first resistor.

2. The comparator of claim 1, wherein the first variable current source includes:
   a first current control transistor and a second resistor provided in series between the first node and the fixed-voltage terminal, and
   wherein a voltage depending on the first input voltage is applied to a control terminal of the first current control transistor.

3. The comparator of claim 1, wherein the first input voltage is a voltage that varies over time and the second input voltage is a constant voltage.

4. The comparator of claim 1, further comprising an output stage configured to generate the comparative output, depending on a signal generated at a second node which is a connection point between one of the first and second input transistors and the load circuit.

5. The comparator of claim 4, wherein the output stage includes:
   an output transistor, the signal generated at the second node being input to a control terminal of the output transistor, and
   a bias current source configured to supply the output transistor with the bias current, the bias current source being provided in series with the output transistor, and
   wherein the comparative output is a signal generated at a third node which is a connection point between the output transistor and the bias current source.

6. A comparator comparing a first input voltage and a second input voltage to generate a comparative output depending on a result of the comparison, comprising:
   a first input terminal configured to receive the first input voltage;
   a second input terminal configured to receive the second input voltage;
   a differential pair including a first input transistor whose control terminal is connected with the first input terminal and a second input transistor whose control terminal is connected with the second input terminal;
   a tail current source configured to supply a tail current to the differential pair;
   a load circuit connected to the first input transistor and the second input transistor; and
   an output stage configured to generate the comparative output, depending on a signal generated at a second node which is a connection point between one of the first and second input transistors and the load circuit,
   wherein the tail current source increases the tail current, as the first input voltage approaches the second input voltage, depending on the first input voltage,
   wherein the output stage includes an output transistor, the signal generated at the second node being input to a control terminal of the output transistor, and a bias current source configured to supply the output transistor with the bias current, the bias current source being provided in series with the output transistor,
   wherein the comparative output is a signal generated at a third node which is a connection point between the output transistor and the bias current source, and
   wherein the bias current source includes:
   a third resistor provided between the third node and the fixed-voltage terminal, and
   a second variable current source configured to generate a current which increases as the first input voltage approaches the second input voltage depending on the first input voltage, the second variable current source being provided in parallel with the third resistor.

7. The comparator of claim 6, wherein the second variable current source includes:

a second current control transistor and a fourth resistor provided in series between the third node and the fixed-voltage terminal, and wherein the voltage depending on the first input voltage is applied to a control terminal of the second current control transistor.

8. The comparator of claim 1, wherein the load circuit is a current mirror circuit.

9. The comparator of claim 1, wherein the load circuit includes a first load resistor provided in series with the first input transistor and a second load resistor provided in series with the second input transistor.

10. A comparator comparing a first input voltage and a second input voltage to generate a comparative output depending on a result of the comparison, comprising:
a first input terminal configured to receive a first input voltage,
a second input terminal configured to receive a second input voltage,
a first input transistor whose gate is connected with the first input terminal, the first input transistor being an N-channel MOSFET,
a second input transistor whose gate is connected with the second input terminal and whose source is connected with a source of the first input transistor, the second input transistor being the N-channel MOSFET,
a first load transistor whose source is connected with a power supply terminal and whose drain and gate are connected with a drain of the first input transistor, the first load transistor being a P-channel MOSFET,
a second load transistor whose source is connected with the power supply terminal, whose drain is connected with a drain of the second input transistor, and whose gate is connected with the gate of the first load transistor, the second load transistor being the P-channel MOSFET,
a first resistor provided between a grounding terminal and sources of the first and second input transistors,
a first current control transistor whose drain is connected with sources of the first and second input transistors and whose gate is connected with the first input terminal, the first current control transistor being the N-channel MOSFET, and
a second resistor provided between a source of the first current control transistor and the grounding terminal,
wherein the comparative output is generated depending on a signal generated at the drain of the second input transistor.

11. The comparator of claim 10 further comprising:
an output transistor whose source is connected with the power supply terminal and whose gate is connected with the drain of the second input transistor, the output transistor being the P-channel MOSFET,
a third resistor provided between a drain of the output transistor and the grounding terminal,
a second current control transistor whose drain is connected with the drain of the output transistor and whose gate is connected with the first input terminal, the second current control transistor being the N-channel MOSFET, and
a fourth resistor provided between a source of the second current control transistor and the grounding terminal.

12. A comparator comparing a first input voltage and a second input voltage to generate a comparative output depending on a result of the comparison, comprising:
a first input terminal configured to receive a first input voltage,
a second input terminal configured to receive a second input voltage,
a first input transistor whose gate is connected with the first input terminal, the first input transistor being a P-channel MOSFET,
a second input transistor whose gate is connected with the second input terminal and whose source is connected with a source of the first input transistor, the second input transistor being the P-channel MOSFET,
a first load transistor whose source is connected with the grounding terminal and whose drain and gate are connected with a drain of the first input transistor, the first load transistor being an N-channel MOSFET,
a second load transistor whose source is connected with the grounding terminal, whose drain is connected with a drain of the second input transistor, and whose gate is connected with the gate of the first load transistor, the second load transistor being the N-channel MOSFET,
a first resistor provided between the power supply terminal and sources of the first and second input transistors,
a first current control transistor whose drain is connected with sources of the first and second input transistors and whose gate is connected with the first input terminal, the first current control transistor being the P-channel MOSFET, and
a second resistor provided between a source of the first current control transistor and the grounding terminal,
wherein the comparative output is generated depending on a signal generated at the drain of the second input transistor.

13. The comparator of claim 12 further comprising:
an output transistor whose source is connected with the grounding terminal and whose gate is connected with the drain of the second input transistor, the output transistor being the N-channel MOSFET,
a third resistor provided between a drain of the output transistor and the power supply terminal,
a second current control transistor whose drain is connected with the drain of the output transistor and whose gate is connected with the first input terminal, the second current control transistor being the P-channel MOSFET, and
a fourth resistor provided between a source of the second current control transistor and the power supply terminal.

* * * * *